(12) United States Patent
Happoya et al.

(10) Patent No.: US 8,896,761 B2
(45) Date of Patent: Nov. 25, 2014

(54) TELEVISION RECEIVER AND ELECTRONIC DEVICE

(75) Inventors: Akihiko Happoya, Ome (JP); Gen Fukaya, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 13/350,598

(22) Filed: Jan. 13, 2012

(65) Prior Publication Data

US 2012/0249883 A1   Oct. 4, 2012

(30) Foreign Application Priority Data

Mar. 31, 2011   (JP) .................................. 2011-080617

(51) Int. Cl.
| | |
|---|---|
| *H04N 5/44* | (2011.01) |
| *H04N 5/64* | (2006.01) |
| *H05K 3/28* | (2006.01) |
| *H05K 1/14* | (2006.01) |
| *H05K 1/03* | (2006.01) |
| *H05K 1/11* | (2006.01) |
| *G02F 1/1345* | (2006.01) |

(52) U.S. Cl.
CPC .................. *H04N 5/64* (2013.01); *H05K 1/147* (2013.01); *H05K 1/0393* (2013.01); *H05K 3/281* (2013.01); *H05K 1/118* (2013.01); *H05K 2203/063* (2013.01); *G02F 1/13452* (2013.01)
USPC .......................................... 348/725; 348/794

(58) Field of Classification Search
USPC ................. 348/725, 787, 789–790, 794, 836; 174/254, 261; 361/749, 772–774, 789, 361/792

IPC ........................................................ H04N 5/44
See application file for complete search history.

(56) References Cited

U.S. PATENT DOCUMENTS

| | | | |
|---|---|---|---|
| 5,408,052 | A | 4/1995 | Inaba et al. |
| 5,516,989 | A * | 5/1996 | Uedo et al. .................... 174/254 |
| 7,348,392 | B2 * | 3/2008 | Smith ............................. 528/28 |
| 2006/0290835 | A1 * | 12/2006 | Sakuma ......................... 349/58 |

FOREIGN PATENT DOCUMENTS

| | | |
|---|---|---|
| JP | S63-038366 | 3/1988 |
| JP | H02-091372 | 7/1990 |
| JP | H05-206589 | 8/1993 |

(Continued)

OTHER PUBLICATIONS

Prior Art Information List in 1 page.

(Continued)

*Primary Examiner* — Trang U Tran
(74) *Attorney, Agent, or Firm* — Knobbe, Martens, Olson & Bear, LLP

(57) ABSTRACT

According to one embodiment, a television receiver includes: a housing; a circuit board; a flexible printed wiring board comprising a base layer, a conductive layer, and a protective layer. The circuit board is installed in the housing. The flexible printed wiring board is configured to be electrically connected to the circuit board. The base layer includes a first surface and a second surface positioned on an opposite side of the first surface. The conductive layer is provided on at least one of the first surface and the second surface of the base layer. The protective layer is configured to cover the base layer and the conductive layer, and includes an outer edge portion positioned on an outside of a periphery portion of the base layer.

8 Claims, 10 Drawing Sheets

(56) References Cited

FOREIGN PATENT DOCUMENTS

| | | |
|---|---|---|
| JP | 07-336026 | 12/1995 |
| JP | H08-148814 | 6/1996 |
| JP | 2004-022879 | 1/2004 |
| JP | 2005-307088 | 11/2005 |
| JP | 2007-169454 | 7/2007 |
| JP | 2008-108909 | 5/2008 |
| JP | 2009-043796 | 2/2009 |
| JP | 2010-195030 | 9/2010 |
| JP | 2010-250035 | 11/2010 |

OTHER PUBLICATIONS

Japanese Office Action dated Sep. 11, 2012 for Japanese Application No. 2011-080617 filed on Mar. 31, 2011.

Japanese Office Action dated Apr. 17, 2012 for Japanese Application No. 2011-080617 filed on Mar. 31, 2011.

Decision to Grant Patent dated Nov. 20, 2012 for Japanese Application No. 2011-080617 filed on Mar. 31, 2011.

* cited by examiner

TELEVISION RECEIVER AND ELECTRONIC DEVICE

CROSS-REFERENCE TO RELATED APPLICATIONS

This application is based upon and claims the benefit of priority from Japanese Patent Application No. 2011-080617, filed Mar. 31, 2011, the entire contents of which are incorporated herein by reference.

FIELD

Embodiments described herein relate generally to a television receiver and an electronic device.

BACKGROUND

Typically, flexible printed wiring boards comprising a base layer and a covering layer covering both sides of the base layer are known.

However, in case the base layer is made of a material having a comparatively low degree of toughness, the flexible printer-wiring board needs to be handled with more caution.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Figure 1:
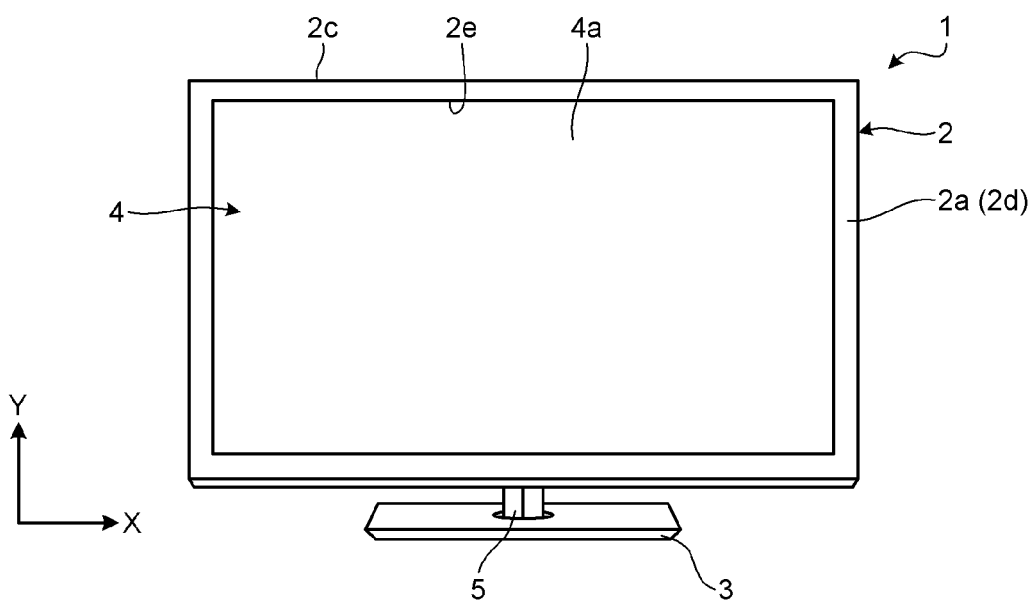
FIG. 1 is an exemplary front view of a television receiver according to a first embodiment.

In general, according to one embodiment, a television receiver comprises: a housing; a circuit board; a flexible printed wiring board comprising a base layer, a conductive layer, and a protective layer. The circuit board is installed in the housing. The flexible printed wiring board is configured to be electrically connected to the circuit board. The base layer comprises a first surface and a second surface positioned on an opposite side of the first surface. The conductive layer is provided on at least one of the first surface and the second surface of the base layer. The protective layer is configured to cover the base layer and the conductive layer, and comprises an outer edge portion positioned on an outside of a periphery portion of the base layer.

In embodiments and modifications described below, identical constituent elements are referred to by the same reference numerals and explanations thereof are given only once without repetition. Moreover, with reference to some of the drawings, directions are defined for the sake of simplicity. More particularly, in a television receiver 1 corresponding to an electronic device, the right-hand direction in the front view (i.e., the left-hand direction in the rear view) of a display screen 4a is assumed to be the X direction, the upward direction is assumed to be the Y direction, and the direction normal to the display screen 4a is assumed to be the Z direction.

Figure 2:
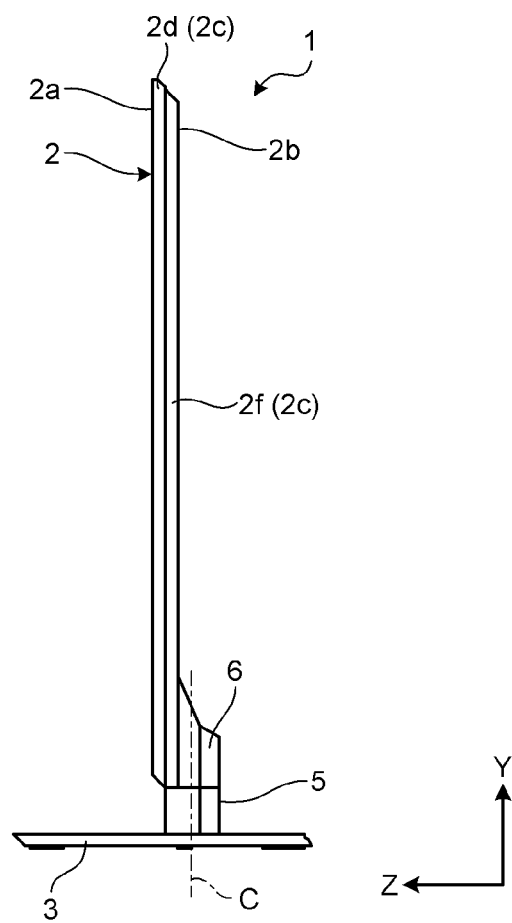
FIG. 2 is an exemplary side view of the television receiver in the first embodiment.

As illustrated in FIGS. 1 and 2, the television receiver 1 according to a first embodiment comprises a platform 3 and a rectangular, flat and comparatively thin main body 2 that is supported on the platform 3 via a leg 5 and a junction 6. In the main body 2, a rectangular opening 2e is formed on a front face 2a of a housing 2c. From the opening 2e, there is exposed the display screen 4a of a display 4 (display unit 8) that is housed in the housing 2c. Herein, the display 4 is a panel (panel unit) such as a liquid crystal display (LCD) or an organic electroluminescent display (OELD). Moreover, the display 4 is an example of a display device, a display module, a module, or a panel.

The housing 2c is configured by, for example, fitting together components such as a front mask 2d on a side of the front face 2a and a rear cover 2f on a side of a rear face 2b. The junction 6 protrudes rearward from the rear face 2b and is supported at the leg 5 in a rotatable manner around an axis of rotation C. The front mask 2d partially constitutes the front wall and the side wall (peripheral wall, upstand wall). Similarly, the rear cover 2f partially constitutes the rear wall and the side walls. The front wall, the side wall, and the rear wall constitute the wall portion. Meanwhile, as illustrated in FIG. 1, the housing 2c has four corners.

Figure 3:
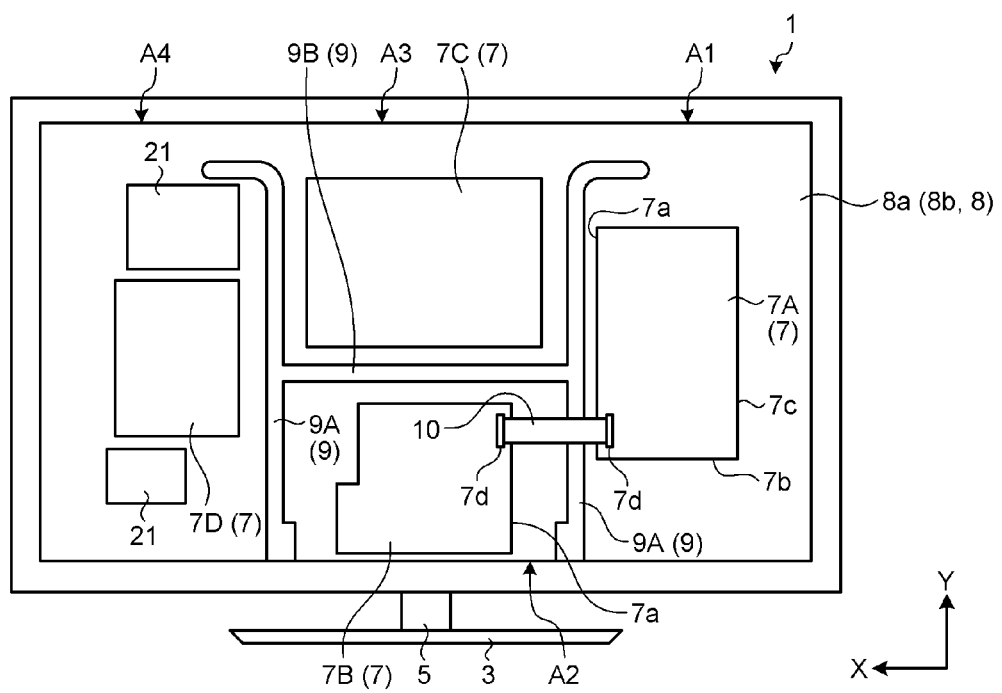
FIG. 3 is an exemplary rear view of an inside of the television receiver in the first embodiment.

In the embodiment, as illustrated in FIG. 3, a plurality of circuit boards 7 (such as circuit boards 7A to 7D) are attached on a rear face 8a of the display unit 8 (i.e., on the face opposite to the display screen 4a), which comprises the display 4, with the use of fastening members such as screws (not illustrated). More particularly, the circuit boards 7 are fixed on a boss portion (not illustrated) that is formed in a protruding manner on the rear face 8a. Hence, there exists a clearance gap between the circuit boards 7 and the rear face 8a.

On a back plate 8b that serves as the wall constituting the rear face 8a of the display unit 8, ribs 9 (9A and 9B) are arranged in a substantially H-shaped manner (as viewed in a line of sight of FIG. 3). The ribs 9 (9A and 9B) protrude from the rear face 8a. Moreover, the ribs 9A (first-type ribs) are arranged spaced apart from each other and parallel to each other at the center of the back plate 8b in the horizontal direction, and extended in the vertical direction. The rib 9B (second-type rib) is horizontally extended and arranged as a bridge between the ribs 9A at the center in the vertical direction of the ribs 9A. The ribs 9A and 9B are structural strengthening members (reinforcing members or framework members) of the display unit 8. The ribs 9A and 9B can be configured by partially pressing the back plate 8b, or by adding a different member, or by partially pressing the back plate 8b and then adding a different member. Meanwhile, on the ribs 9 (e.g., on the ribs 9A), a fastening portion (such as a boss portion or a screw hole, not illustrated) is formed for VESA (registered trademark) mounting purpose, that is, for wall-hanging purpose.

In the first embodiment, as illustrated in FIG. 3, due to the ribs 9A and 9B arranged in a substantially H-shaped manner, the rear face 8a of the display unit 8 is partitioned in following four areas when viewed from behind: a first area A1 formed on the right side of the right-hand side rib 9A; a second area A2 formed below the rib 9B at the center in the horizontal direction; a third region A3 formed above the rib 9B; and a fourth area A4 formed on the left side of the left-hand side rib 9A. Among the areas A1 to A4, various circuit boards 7 (such as circuit boards 7A to 7D, a substrate, a printed circuit board, a printed wiring board, an interconnection substrate, a rigid substrate, and the like) or a component 21 are arranged in a suitably dispersed manner.

For example, in the first embodiment, the circuit board 7A (first circuit board) is disposed in the first area A1; the circuit board 7B (second circuit board) is disposed in the second area A2; the circuit board 7C (third circuit board) is disposed in the third area A3; and the circuit board 7D (fourth circuit board) is disposed in the fourth area A4. Moreover, in the fourth area A4 is also disposed the component 21 (a module such as a hard disk drive or a speaker). Besides, each circuit board is covered with a shield case (not illustrated).

On the circuit boards 7, it is possible to configure (mount) various circuits such as an input signal processing circuit, a frame rate converter (FRC) circuit, a timing control (Tcon) circuit, and a driver circuit (XY driver).

The input signal processing circuit comprises a tuner (not illustrated) or a connector (not illustrated), and processes signals received from a component such as an antenna or from an audio visual (AV) device and outputs image (video) data and sound (audio) data. Besides, the input signal processing circuit can also perform various operations such as image processing, correction, and video composition.

The frame rate converter circuit receives the video data from the input signal processing circuit and, for example, performs frame rate conversion of the video by generating interpolation frames from the motion vectors of the video. Besides, the frame rate converter circuit can also perform operations for generating three-dimensional (3-D) graphics or operations for achieving high definition. As compared to the transmission quantity per unit time of the video data fed to the frame rate converter circuit, the video data output from the frame rate converter circuit has an increased transmission quantity per unit time.

Upon receiving the video data from the frame rate converter circuit, the timing control circuit generates timing signals for controlling the driver circuit that is mounted at the subsequent stage, and outputs the video data and the timing signals.

On the basis of the timing signals received from the timing control circuit, the driver circuit drives the display 4 so as to display predetermined video on the display 4.

In the first embodiment, for example, the input signal processing circuit is mounted on the circuit board 7A, while the frame rate converter circuit and the timing control circuit are mounted on the circuit board 7B. In that case, as illustrated in FIG. 3, the circuit boards 7A and 7B are positioned in such a manner that the right-hand side rib 9A is sandwiched between the circuit boards 7A and 7B.

Moreover, in the first embodiment, for example, the circuit boards 7A and 7B are electrically connected via a flexible printed wiring board 10 (a flexible printed wiring assembly, a flexible wiring assembly, a flexible printed circuit (FPC)) as illustrated in FIG. 3. As described above, one of the ribs 9A that is positioned between the circuit boards 7A and 7B protrudes rearward. Consequently, as compared to the region not having the ribs 9; the back plate 8b, which serves as the wall, and the rear cover 2f, which serves as the rear wall of the housing 2c (see FIG. 2), have a smaller clearance gap therebetween. In the present embodiment, the data transmission quantity between the circuit boards 7A and 7B is comparatively smaller at a stage prior to being increased by the frame rate converter circuit. Hence, the flexible printed wiring board 10 can be used as a cable for electrically connecting the circuit boards 7A and 7B. Thus, in the first embodiment, it becomes possible to prevent the cable (number or thickness) to be an obstacle in achieving downsizing or in improving resistance properties or strength. Besides, as compared to a configuration in which the circuit boards are electrically connected by a number of twisted pair cables, it becomes possible to reduce the time and effort as well as the cost of manufacturing.

In the circuit board 7A, a plurality of connectors (connectors for external connections, not illustrated) are disposed along edges of the circuit board 7A (periphery portions, for example, edges 7b and 7c). In case of a configuration in which the connectors are exposed from the clearance gap (opening) between the rear cover 2f and the back plate 8b, positioning of the circuit board 7A in the first area A1 makes it easier for the edges (periphery portions, for example, edges 7b and 7c) of the circuit board 7A to lie along the periphery portion of the back plate 8b. As a result, it becomes easier to form the clearance gap (opening).

Figure 4:
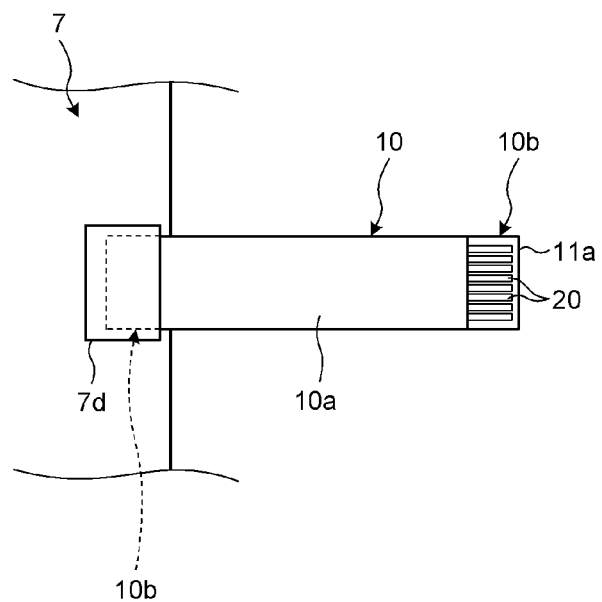
FIG. 4 is an exemplary plan view of a flexible printed wiring board in the first embodiment.

As illustrated in FIG. 4, the flexible printed wiring board 10 is of a predetermined width and extends in a belt-like manner. Moreover, the flexible printed wiring board 10 has an extended portion 10a and has edge portions 10b in the longitudinal direction of the extended portion 10a. Each edge portion 10b is configured to be a connector having a terminal 20 (terminal member, connection terminal, contact, contact member, conductor) being exposed therefrom. As also illustrated in FIG. 3, the edge portions 10b are coupled (connected) by insertion to connectors 7d, each of which is disposed adjacent to an edge 7a of one of the circuit boards 7 (7A or 7B). When the terminals 20 at the edge portions 10b make contact with terminals (not illustrated) at the connectors 7d, electricity starts flowing therebetween and the conductor in the circuit board 7A is electrically connected to the conductor in the circuit board 7B via the terminals 20 and via internal conductive layers 12 and 14 (conductor layer, see FIG. 15) that are formed on the flexible printed wiring board 10.

Figure 5:
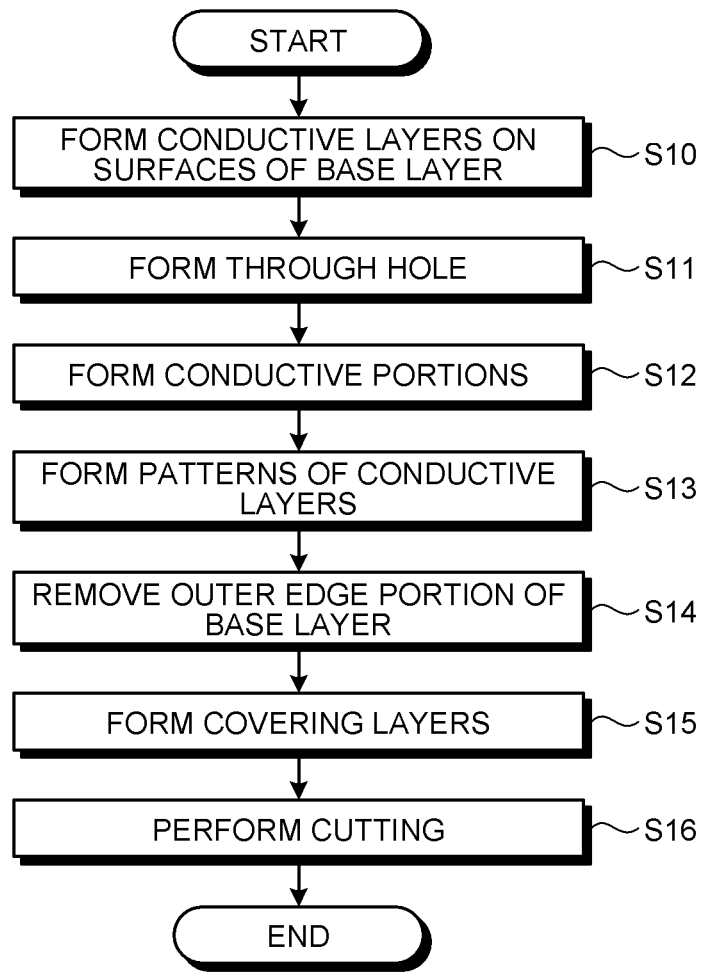
FIG. 5 is an exemplary flowchart of a manufacturing method of the flexible printed wiring board in the first embodiment.

FIG. 5 is a flowchart for explaining an example of a manufacturing method of a flexible printed wiring board 10A (10) illustrated in FIGS. 6 to 15. The flexible printed wiring board 10A is an L-shaped board in planar view. Herein, FIGS. 6 to 15 are schematic views (cross-sectional views or plan views) of the flexible printed wiring board 10A at each step of the manufacturing method. The flexible printed wiring board 10A, illustrated in FIGS. 6 to 15, can also be mounted in the television receiver 1. Moreover, the flexible printed wiring board 10A is only an example, and the manufacturing method illustrated in FIGS. 5 to 15 can also be implemented to manufacture the flexible printed wiring board 10 of other shapes.

Figure 6:
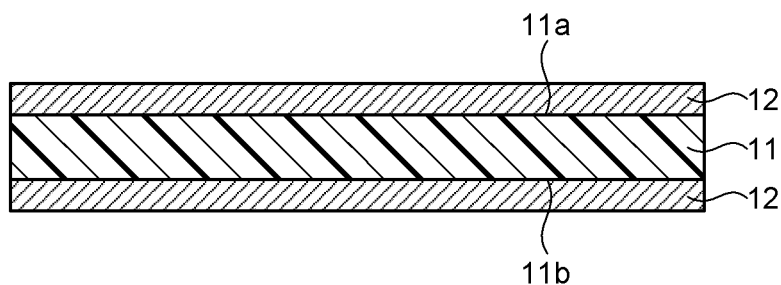
FIG. 6 is an exemplary schematic view (cross-sectional view) of a state in which conductive layers are formed on a base layer by the manufacturing method of the flexible printed wiring board, in the first embodiment.

Firstly, as illustrated in FIG. 6, the conductive layers 12 (a conductor layer, a wiring layer, a second layer, a second portion, or a second area) are formed on a first surface 11a and a second surface 11b of a base layer 11 (a base portion, a first layer, a first portion, or a first area), respectively (S10 in FIG. 5, forming of the conductive layers).

The base layer 11 is an example of an intermediate layer, an inner layer, an insulating layer, or a lower layer. The base layer 11 is made of, for example, prepreg, which has a sheet-like flexible structure manufactured by impregnating uncured resin material (such as thermosetting resin or epoxy resin) in a fiber such as carbon fiber, glass fiber, or aramid fiber. As compared to a synthetic resin material such as polyimide or polyethylene terephthalate, prepreg is inexpensive but has a lower degree of toughness and tears easily.

The conductive layers 12 are, for example, a copper foil that is laid on surfaces (the first surface 11a and the second surface 11b), respectively, of the base layer 11 by coating, sputtering, evaporation coating, or adhesion.

Figure 7:
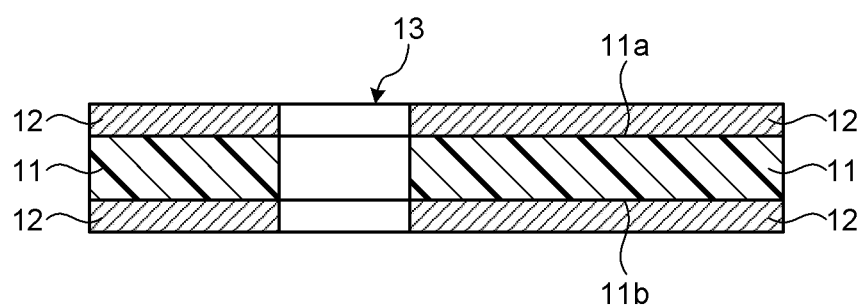
FIG. 7 is an exemplary schematic view (cross-sectional view) of a state in which a through hole is formed in the configuration illustrated in FIG. 6 by the manufacturing method of the flexible printed wiring board, in the first embodiment.

Subsequently, as illustrated in FIG. 7, a through hole 13 is formed by, for example, punching at a predetermined position in the configuration illustrated in FIG. 6 (S11 in FIG. 5, forming of the through hole). At S11, the through hole 13 penetrates the base layer 11 and the conductive layers 12 formed on the surfaces of the base layer 11 in a width direction (vertical direction in FIG. 7).

Figure 8:
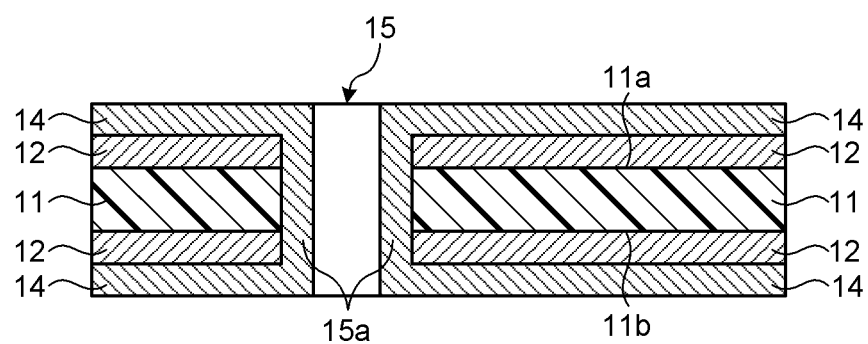
FIG. 8 is an exemplary schematic view (cross-sectional view) of a state in which plating is performed on the configuration illustrated in FIG. 7 by the manufacturing method of the flexible printed wiring board, in the first embodiment.

Then, as illustrated in FIG. 8, either only a portion including the through hole 13 or the entire portion of the configuration illustrated in FIG. 7 is subjected to, for example, plating. That results in the formation of the conductive layers 14, which cover both sides of the configuration illustrated in FIG. 7. Because of the plating, a plated through hole 15 is formed with conductive portions 15a so that the conductive layers 12 and 14 on the side of the first surface 11a are electrically connected to the conductive layers 12 and 14 on the side of the second surface 11b (S12 in FIG. 5, forming of the conductive portion).

Figure 9:
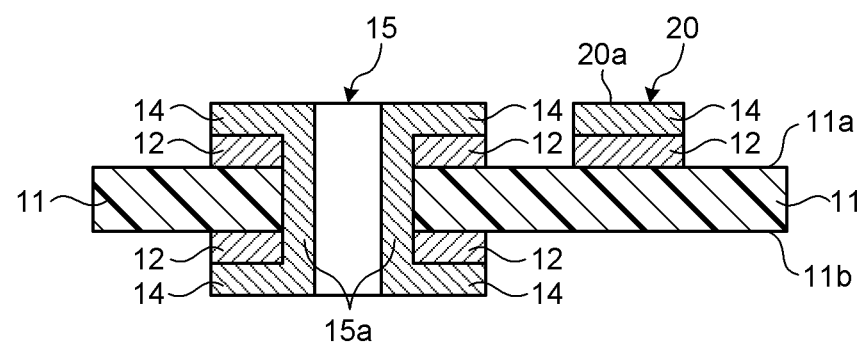
FIG. 9 is an exemplary schematic view (cross-sectional view) of a state in which etching is performed on the configuration illustrated in FIG. 8 by the manufacturing method of the flexible printed wiring board, in the first embodiment.

Subsequently, as illustrated in FIG. 9, for example, etching is performed on the conductive layers 12 and 14, which are formed on the surfaces of the base layer 11 (the first surface 11a and the second surface 11b) in the configuration illustrated in FIG. 8. That results in the formation of the patterns of the conductive layers 12 and 14 (conductor patterns, wiring patterns, wiring) (S13 in FIG. 5, forming of the conductive layer pattern).

Figure 10:
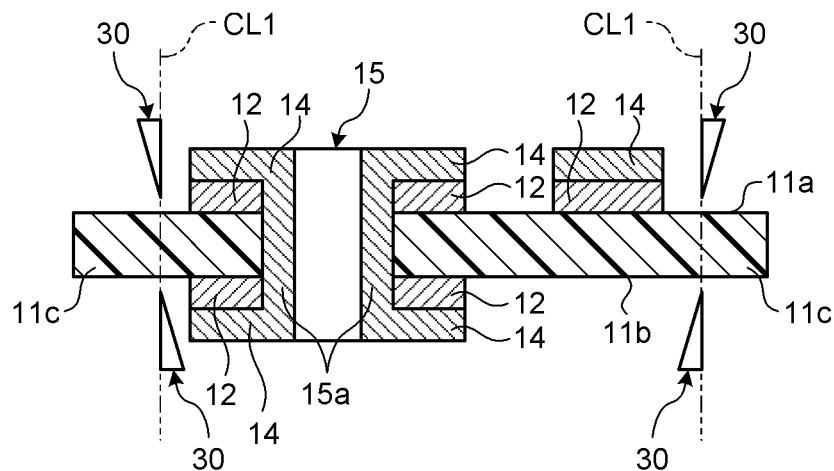
FIG. 10 is an exemplary schematic view (cross-sectional view) of a state in which a first cutting is to be performed on the configuration illustrated in FIG. 9 by the manufacturing method of the flexible printed wiring board, in the first embodiment.

Then, as illustrated in FIG. 10, for example, a cutting device or a cutting tool such as a cutter 30 or a punch (not illustrated) is used to cut the configuration illustrated FIG. 9 along first cutting lines CL1. That results in the removal of outer edge portions 11c (portions equivalent to the outer edge portions of the flexible printed wiring board 10) of the base layer 11 (S14 in FIG. 5, removing of the outer edge portion of the base layer).

Figure 11:
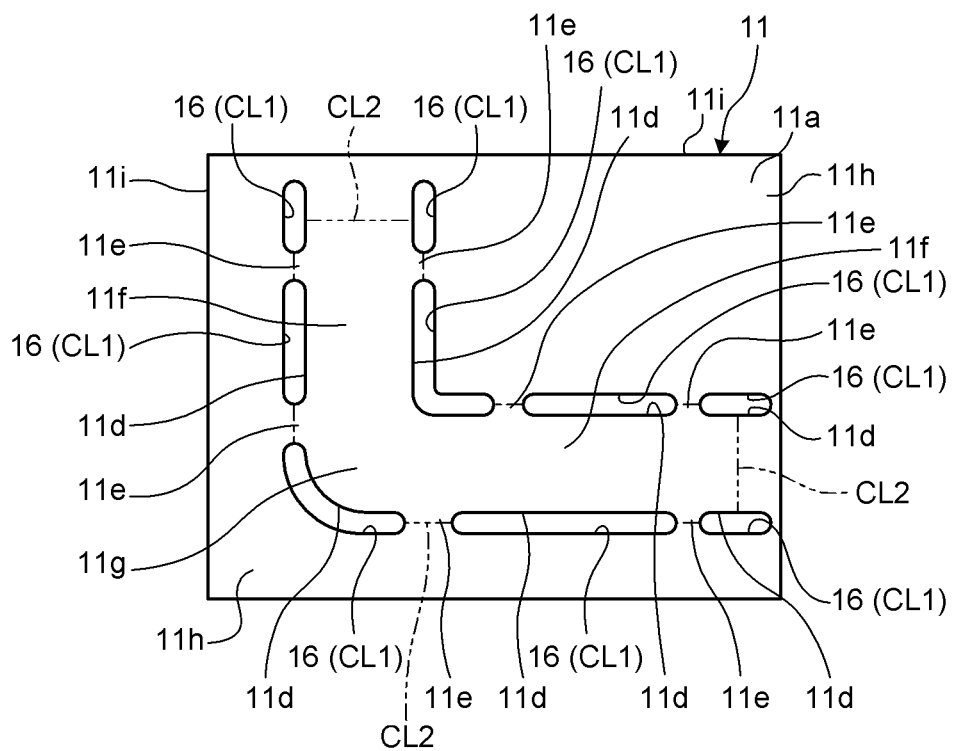
FIG. 11 is an exemplary schematic view (plan view) of the base layer obtained when the first cutting is performed on the configuration illustrated in FIG. 9 by the manufacturing method of the flexible printed wiring board, in the first embodiment.

As illustrated in FIG. 11, for example, midway through the manufacturing process, the base layer 11 has a rectangular outer edge 11i. At S14, for example, elongated openings 16 are formed on the base layer 11. Due to the openings 16, the flexible printed wiring board 10A is divided into an available area (having extended portions 11f and a curved portion 11g) and a redundant area 11h (unused portion, surplus portion, or removable portion). In the available area, for example, the extended portions 11f extend in a linear fashion (belt-like fashion) and the curved portion 11g is curved in an arc-like fashion. The extended portions 11f and the curved portion 11g run along the first surface 11a and the second surface 11b (see FIG. 10). Meanwhile, the openings 16 constitute outer edge portion 11d (periphery portions, periphery) in the width direction (lateral direction) of the extended portions 11f and the curved portion 11g. Moreover, in the example illustrated in FIG. 11, the openings 16 are formed in plurality and are spaced apart from each other along the side edges of the available area (the extended portions 11f and the curved portion 11g). Thus, at the intervals in between the openings 16, the available area (the extended portions 11f and the curved portion 11g) is attached to the redundant area 11h. Meanwhile, although the openings 16 are illustrated to be through holes in FIG. 11, it is also possible to form the openings 16 as notches.

Figure 12:
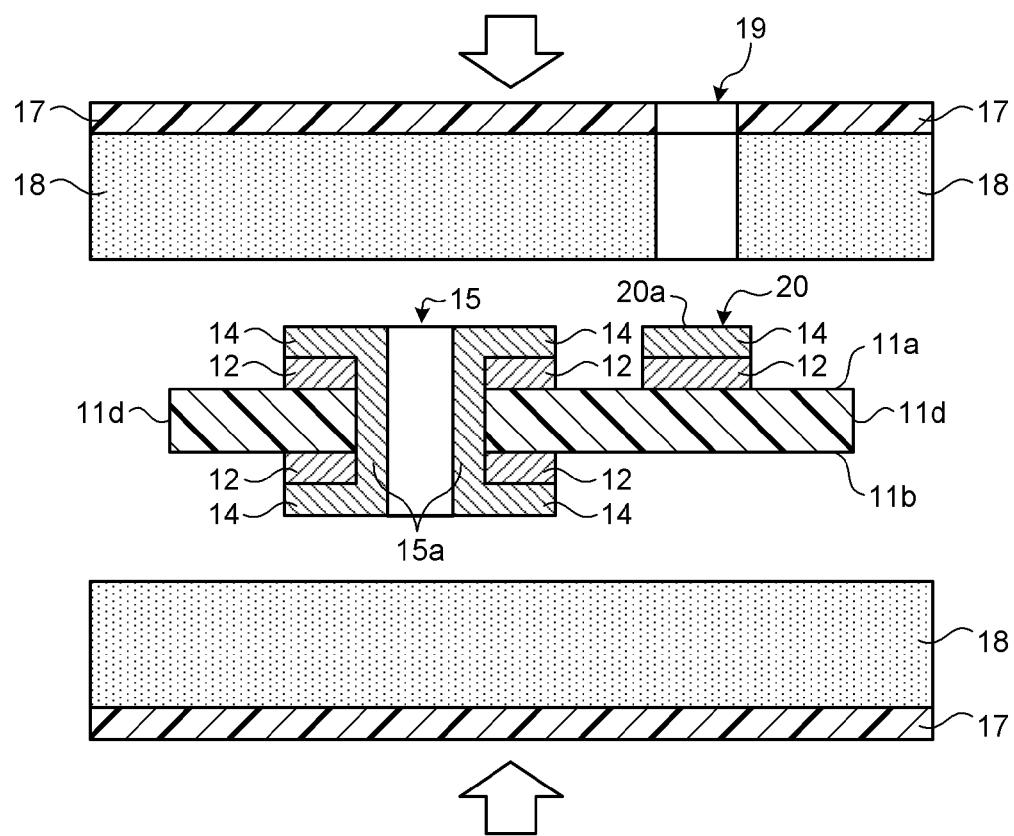
FIG. 12 is an exemplary schematic view (cross-sectional view) of a state in which the configuration obtained through the first cutting as illustrated in FIG. 10 is covered by a protective layer by the manufacturing method of the flexible printed wiring board, in the first embodiment.

Subsequently, as illustrated in FIG. 12, covering layers 17 (covering portions, covering layers, outer layers, upper layers, third layers, third portions, or third areas) are formed (pasted or attached) on the first surface 11a and the second surface 11b of the base layer 11 via adhesive layers 18 (adhesive portions, joining portions, connection layers, fourth layers, fourth portions, or fourth areas) (S15 in FIG. 15, covering-layer-forming), respectively. The covering layers 17 are examples of covering layers, protective layers, or insulating layers. One of the covering layers 17 formed on the first surface 11a is an example of a first protective layer (first covering layer), while other one of the covering layers 17 formed on the second surface 11b is an example of a second protective layer (second covering layer). The covering layers 17 can be made from, for example, an engineering plastic film (synthetic resin material) of polyimide (PI), polyethylene terephthalate (PET), liquid crystal polymer (LCP), or the like.

As illustrated in FIG. 12, at a position of the covering layers 17 and the adhesive layers 18 corresponding to at least one of the conductive layers 12 and 14, an opening 19 (an exposed opening or an aperture) is formed as for example a through hole or a notch. The conductive layers 12 and 14 corresponding to the opening 19 are an example of the terminal 20

(terminal member, connection terminal, contact, contact member, conductor). The surface of the conductive layer 12 or the conductive layer 14 (as an example in the first embodiment, the surface of the conductive layer 12) represents a contact surface 20a (a facing surface or an exposed surface).

Figure 13:
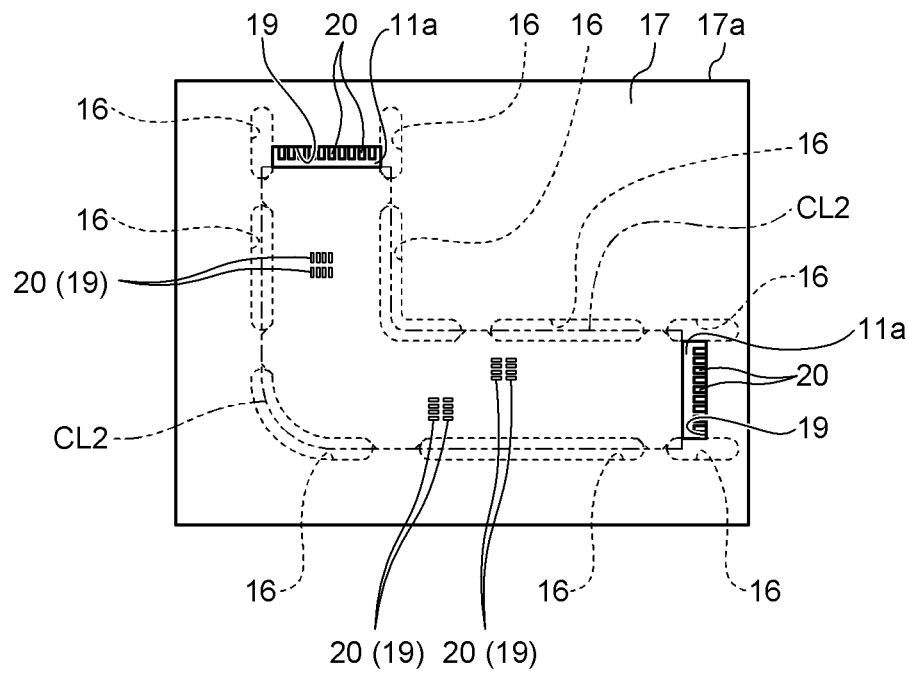
FIG. 13 is an exemplary schematic view (plan view) of a state in which the configuration obtained through the first cutting as illustrated in FIG. 10 is covered by the protective layer by the manufacturing method of the flexible printed wiring board, in the first embodiment.

FIG. 13 illustrates a configuration in which the base layer 11 is covered by the covering layers 17. As illustrated in FIG. 13, midway through the manufacturing process, for example, the covering layer 17 has a rectangular outer edge 17a corresponding to (consistent to) the base layer 11 illustrated in FIG. 11. Thus, at S15, as illustrated in FIGS. 10 and 11, the positioning of the covering layers 17 can be done by the overlapping of the outer edge 11i of the base layer 11 and the outer edge 17a of the covering layer 17. Meanwhile, overlapping of the outer edges 11i and 17a is only an example and, other than making use of the outer edges 11i and 17a, it is also possible to have a positioning mechanism (such as an aligned through hole) in the base layer 11 and the covering layer 17.

Figure 14:
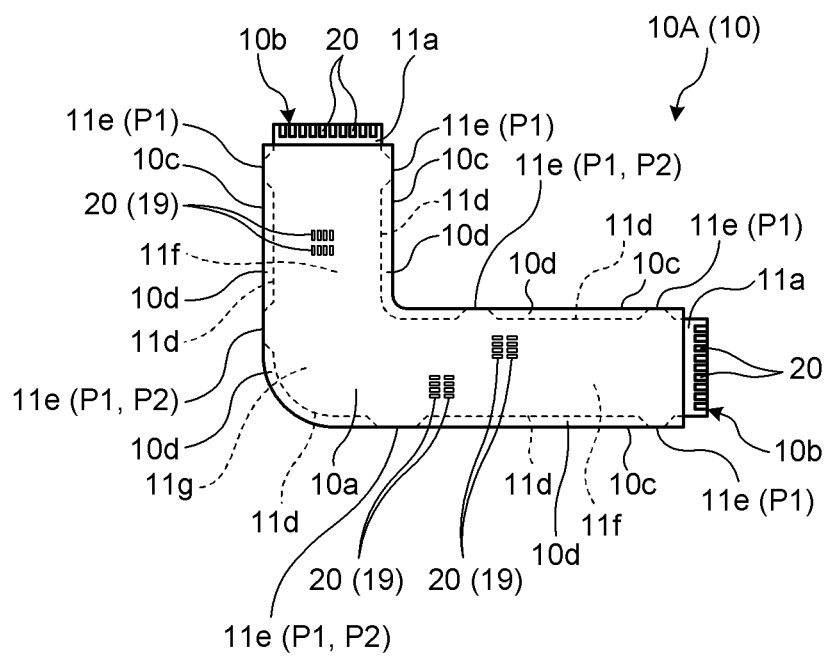
FIG. 14 is an exemplary schematic view (plan view) of the flexible printed wiring board obtained when a second cutting is performed on the configuration comprising a protective layer as illustrated in FIG. 12 by the manufacturing method of the flexible printed wiring board, in the first embodiment.
Figure 15:
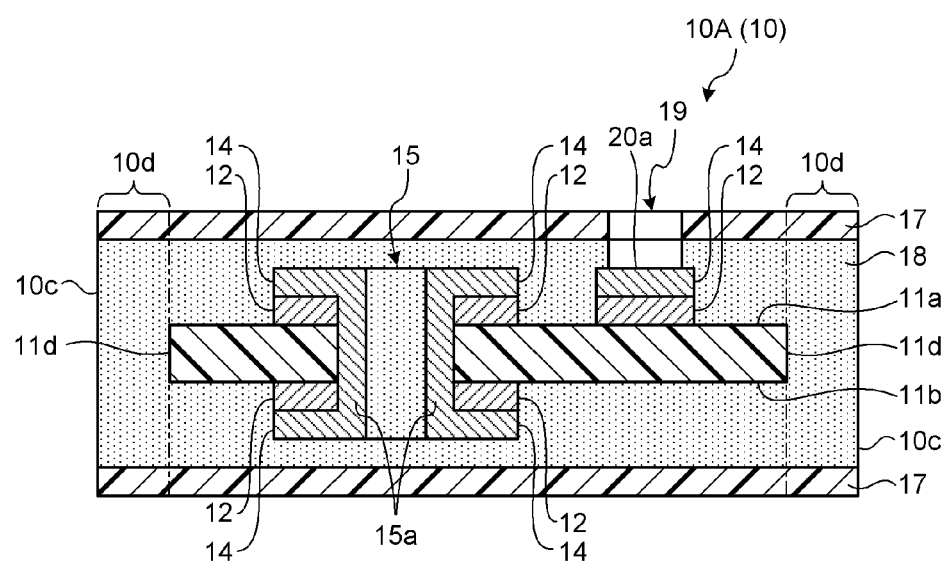
FIG. 15 is an exemplary schematic view (cross-sectional view) of the flexible printed wiring board obtained when the second cutting is performed on the configuration comprising the protective layer as illustrated in FIG. 12 by the manufacturing method of the flexible printed wiring board, in the first embodiment.

Subsequently, the configuration illustrated in FIG. 13, that is, the configuration in which the base layer 11 is covered from both sides by the covering layers 17 is cut along second cutting lines CL2 using a cutting tool such as a cutter (not illustrated) or a cutting device (not illustrated). As a result, the redundant area is removed and the flexible printed wiring board 10A illustrated in FIGS. 14 and 15 is obtained (S16 in FIG. 16, cutting). As illustrated in FIG. 13, the second cutting lines CL2 pass through the openings 16 that are formed on the base layer 11. Hence, as illustrated in FIGS. 14 and 15, in the area in which the openings 16 are formed, the outer edges 11d of the base layer 11 recede in the width direction as compared to side edges 10c (outer edges) of the flexible printed wiring board 10A defined by the second cutting lines CL2. As a result, as illustrated in FIG. 15, outer edge portions 10d of the covering layers 17 and the adhesive layers 18 are formed on the outside of the outer edges 11d of the base layer 11. Hence, according to the first embodiment, if the base layer 11 is made of a material such as prepreg having a comparatively lower degree of toughness; then it is possible to form such a region in the flexible printed wiring board 10A in which the outer edges 11d of the base layer 11 are not exposed at the side edges 10c of the flexible printed wiring board 10A. Hence, (the outer edges 11d) of the base layer 11 can be protected by the outer edge portions 10d (in the present embodiment, for example, by the covering layers 17 and the adhesive layers 18) other than the base layer 11. Thus, the outer edge portions 10d are an example of protective portions.

Meanwhile, at the intervals in between the adjacent openings 16 at which the available area (the extended portions 11f and the curved portion 11g) is attached to the redundant area 11h, the second cutting lines CL2 are positioned outside of the outer edges 11d of the base layer 11 within the area in which the openings 16 are formed. That results in the formation of projections 11e, which protrude outward from the outer edges 11d. Thus, the projections 11e are formed by keeping connecting portions (attaching portions) at which the available area (the extended portions 11f and the curved portion 11g) is attached to the redundant area 11h. That makes it easier to position the base layer 11 at S15 and S16 described above. Meanwhile, at the portions at which the projections 11e are formed, the base layer 11 gets exposed to the side edges 10c of the flexible printed wiring board 10A. Hence, if the base layer 11 is made of a material such as prepreg having a comparatively lower degree of toughness; then, at the portions at which the projections 11e are formed, the strength of the flexible printed wiring board 10A decreases as compared to the portions at which the outer edges 11d recede more than the side edges 10c. By taking this point into consideration, in the first embodiment, the projections 11e are formed at end portions P1 in an extending direction of the extended portions 11f of the base layer 11 and formed at end portions P2 in a circumferential direction of the curved portion 11g. When the flexible printed wiring board 10A is bent, the bending stress may be concentrated at the intermediate portion (central portion) in the extending direction of the extended portions 11f or at the intermediate portion (central portion) in the circumferential direction of the curved portion 11g. For that reason, the projections 11e are formed at the end portions P1 and P2, which are not the intermediate portions. Hence, as compared to a case when the projections 11e are formed at the intermediate portions at which the bending stress gets concentrated, the flexible printed wiring board 10A can have enhanced strength.

As described above in the first embodiment, in the flexible printed wiring board 10A, the covering layers 17 and the adhesive layers 18 serve as the protective layers, which cover the base layer 11 and the conductive layers 12 and 14 and which have the outer edge portions 10d thereof positioned outside of the outer edges 11d as the periphery portions of the base layer 11. As a result, the flexible printed wiring board 10A can be manufactured to be damage-resistant.

Moreover, in the first embodiment, on the base layer 11 are formed the projections 11e, which protrude outward from the outer edges 11d serving as the periphery portions of the base layer 11 and which extend up to the outer edge of the covering layers 17. Such projections 11e make it easier to manufacture the flexible printed wiring board 10A.

Furthermore, in the first embodiment, the projections 11e are formed at the end portions P1 in the extending direction of the extended portions 11f, and also formed at the end portions P2 in the circumferential direction of the curved portion 11g. Thus, the projections 11e are formed at such positions at which the bending stress does not get concentrated. By forming such projections 11e, decrease in strength of the flexible printed wiring board 10A can be prevented.

Moreover, in the flexible printed wiring board 10A according to the first embodiment, each of the adhesive layers 18 is formed between the base layer 11 and one of the covering layers 17 to bond the covering layers 17 to the base layer 11. Thus, as compared to a case when the adhesive layers 18 are not formed, the flexible printed wiring board 10A can be manufactured to be damage-resistant.

Furthermore, in the flexible printed wiring board 10A according to the first embodiment, two covering layers 17 are formed, of which one covering layer 17 serves as the first protective layer for covering the first surface 11a of the base layer 11 and the other covering layer 17 serves as the second protective layer for covering the second surface 11b of the base layer 11. The outer edge portions of the two covering layers 17 are joined at the outer edge portions 10d of the flexible printed wiring board 10A. As a result, the flexible printed wiring board 10A can be manufactured to be damage-resistant. Besides, in the first embodiment, the adhesive layers 18 are formed to enable bonding of the covering layers 17, which serve as the first protective layer and the second protective layer. Hence, the flexible printed wiring board 10A can be manufactured to be even more damage-resistant.

Figure 16:
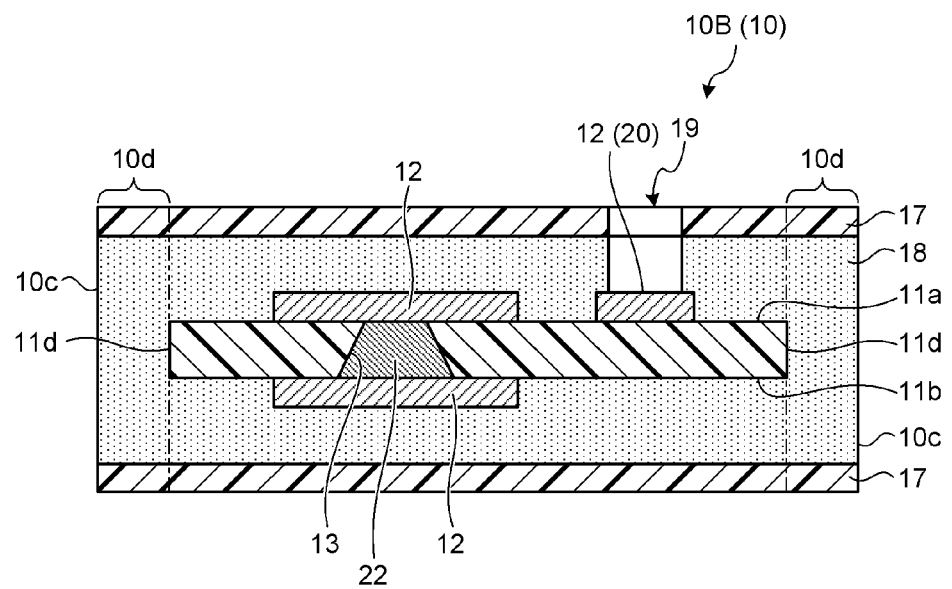
FIG. 16 is an exemplary schematic view (cross-sectional view) of the flexible printed wiring board according to a modification of the first embodiment.

In FIG. 16 is illustrated a flexible printed wiring board 10B (10) according to a modification of the first embodiment. The flexible printed wiring board 10B can be substituted for the flexible printed wiring board 10A described in the first embodiment. In the flexible printed wiring board 10B, in place of forming the conductive portions 15a (see FIG. 15) by plating, the through hole 13 formed in the base layer 11 is filled with an electrical conductor such as a conductive paste 22 by processing other than plating. In such a configuration too, it is possible to achieve the same advantages as described in the first embodiment.

Figure 17:
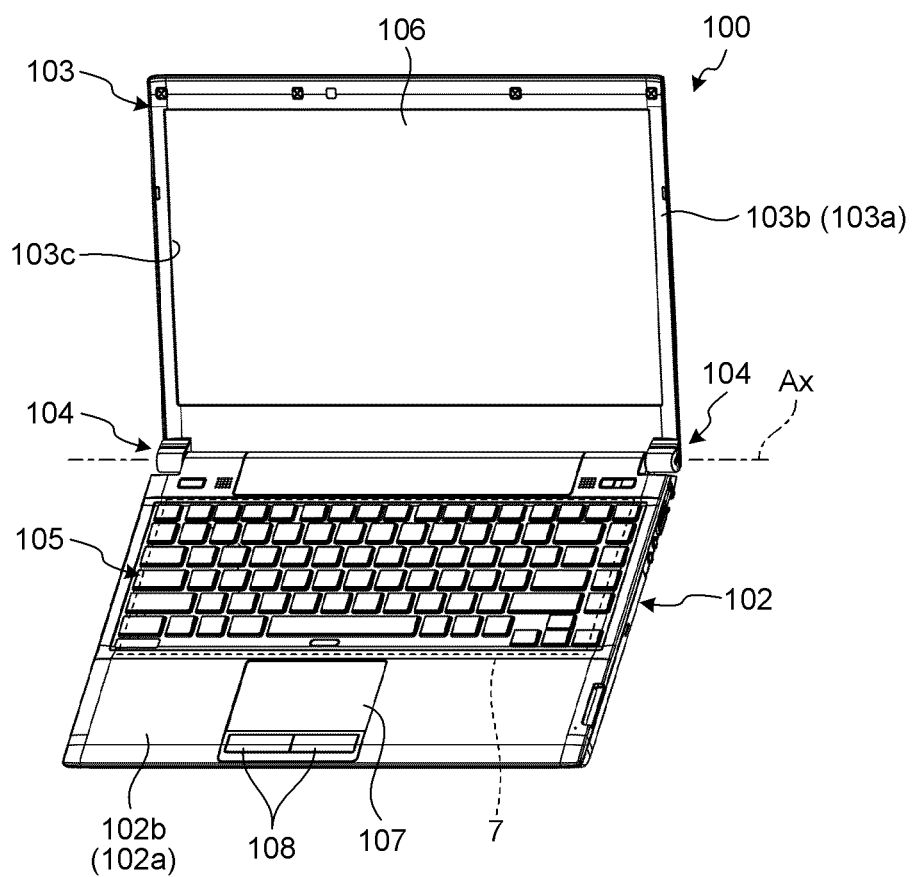
FIG. 17 is an exemplary perspective view of an electronic device according to a second embodiment.

Meanwhile, the abovementioned flexible printed wiring board 10 can also be disposed in an electronic device 100 illustrated in FIG. 17. The electronic device 100 is configured to be a notebook-sized personal computer comprising a rectangular and flat first main body 102 and a rectangular and flat second main body 103. The first main body 102 and the second main body 103 are connected via a joint 104 in a relatively rotatable manner around a rotary shaft Ax between an open state illustrated in FIG. 17 and a folded state (not illustrated).

In the first main body 102; a keyboard 105, a pointing device 107, and click buttons 108 functioning as input receiver are arranged in an exposed manner on a front face 102b that is the external face of a housing 102a (a first housing). Similarly, in the second main body 103; a display 106, which is a display device such as a liquid crystal display (LCD), is arranged in an exposed manner on a front face 103b that is the external face of a housing 103a (a second housing). In the open state of the electronic device 100 illustrated in FIG. 17; the keyboard 105, the display 106, the pointing device 107, and the click buttons 108 lie in an exposed condition. In such open state, the user is able to perform operations. In contrast, in the folded state (not illustrated) of the electronic device 100; the front faces 102b and 103b face each other from up close in such a way that the keyboard 105, the display 106, the pointing device 107, and the click buttons 108 are hidden by the housings 102a and 103a.

The housing 102a of the first main body 102 houses components such as the circuit boards 7, a central processing unit (CPU), a read only memory (ROM), a random access memory (RAM), a board assembly having other components mounted thereon, a hard disk, and a cooling fan (no component is illustrated). To the circuit boards 7 is electrically-connected the flexible printed wiring board 10 (not illustrated in FIG. 17) according to the first embodiment or the modification example thereof. Since the electronic device 100 according to the second embodiment comprises the flexible printed wiring board 10, it is possible to achieve the same advantages as described in the first embodiment or the modification example thereof.

Herein, although the embodiments and the modification are described for a complete and clear disclosure, the appended claims are not to be thus limited but are to be construed as embodying all modifications and alternative constructions that may occur to one skilled in the art that fairly fall within the basic teaching herein set forth. For example, apart from the electronic device described above, the embodiments and the modification are also applicable to other electronic devices comprising a flexible printed wiring board. Besides, the constituent elements illustrated in the drawings are merely conceptual, and need not be physically configured as illustrated. The constituent elements, as a whole or in part, can be separated or integrated either functionally or physically based on various types of loads or use conditions. Moreover, apart from the belt-like shape, the flexible printed wiring board can also be manufactured in other shapes. Furthermore, instead of the covering layers and the protective layers, other members can be disposed as the protective portions. For example, on the outer edge portions of the base layer, members of a material having a higher degree of toughness than the base layer (e.g., tapes or films made of a synthetic resin material such as polyimide or polyethylene terephthalate) can be disposed (pasted or attached) as the protective portions. Meanwhile, regarding the television receiver, the electronic device, the housing, the circuit board, the flexible printed wiring board, the base layer, the conductive layers, the protective layers, the conductive portions, the outer edge portions, the projections, the extended portions, the curved portion, the adhesive layers, the first protective layer, the second protective layer, the portions on the outside of the outer edge portions of the base layer, the protective layers having a higher degree of toughness than the base layer, the covering layers, the protective portions, and the terminal; the specifications (structure, type, direction, shape, size, length, width, thickness, number, arrangement, position, material, etc.) can be suitably modified.

In this way, according to embodiments and modifications, a television receiver and an electronic device comprising a damage-resistant flexible printed wiring board can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a housing;
   a circuit board installed in the housing; and
   a flexible printed wiring board configured to be electrically connected to the circuit board and comprising:
      a base layer comprising a first surface and a second surface positioned on an opposite side of the first surface, the base layer being an insulating layer;
      a conductive layer provided on at least one of the first surface and the second surface of the base layer; and
      a protective layer configured to cover the base layer and the conductive layer, wherein
   the base layer is made of a prepreg, and
   the base layer comprises:
      a first portion comprising a periphery portion positioned inward with respect to an outer edge of the protective layer in a width direction of the flexible printed wiring board; and
      a projection configured to project, in the width direction of the flexible printed wiring board, to the outer edge of the protective layer from the periphery portion of the first portion positioned inward with respect to the outer edge of the protective layer.

2. The electronic device of claim 1, wherein the projection is positioned at an end of the first portion in a direction toward which a portion of the first portion linearly extends.

3. The electronic device of claim 1, wherein the projection is positioned at an end of the first portion in a direction toward which a portion of the first portion extends in a curved manner.

4. The electronic device of claim 1, wherein the flexible printed wiring board comprises an adhesive layer positioned between the base layer and the protective layer so as to bond the base layer and the protective layer to each other.

5. The electronic device of claim 1, wherein,
   as the protective layer, the flexible printed wiring board comprises a first protective layer configured to cover the first surface of the base layer and a second protective layer configured to cover the second surface of the base layer, and an outer edge portion of the first protective layer and an outer edge portion of the second protective layer are bonded to each other.

6. The electronic device of claim 5, wherein the flexible printed wiring board comprises an adhesive layer positioned between the base layer and at least one of the first protective layer and the second protective layer, and the first protective layer and the second protective layer are bonded to each other by the adhesive layer.

7. An electronic device comprising:

a housing;

a circuit board installed in the housing; and a flexible printed wiring board configured to be electrically connected to the circuit board and comprises:

a base layer comprising a first surface and a second surface positioned on an opposite side of the first surface, the base layer being an insulating layer;

a conductive layer provided on at least one of the first surface and the second surface of the base layer; and a protective layer with a higher toughness than that of the base layer, the protective layer being configured to cover the base layer and the conductive layer, wherein the base layer is made of a prepreg, and the base layer comprises:

a first portion comprising a periphery portion positioned inward with respect to an outer edge of the protective layer in a width direction of the flexible printed wiring board; and a projection configured to project, in the width direction of the flexible printed wiring board, to the outer edge of the protective layer from the periphery portion of the first portion positioned inward with respect to the outer edge of the protective layer.

8. An electronic device comprising:

a housing;

a circuit board installed in the housing; and a flexible printed wiring board configured to be electrically connected to the circuit board and comprises:

a base layer comprising a first surface and a second surface positioned on an opposite side of the first surface, the base layer being an insulating layer;

a conductive layer provided on at least one of the first surface and the second surface of the base layer; and a covering layer configured to cover at least the conductive layer, wherein the base layer is made of a prepreg, and the base layer comprises:

a first portion comprising a periphery portion positioned inward with respect to an outer edge of the covering layer in a width direction of the flexible printed wiring board; and a projection configured to project, in the width direction of the flexible printed wiring board, to the outer edge of the covering layer from the periphery portion of the first portion positioned inward with respect to the outer edge of the covering layer.

* * * * *